United States Patent [19]

Buckinx

[11] 4,450,420
[45] May 22, 1984

[54] SURFACE ACOUSTIC WAVE FILTER

[75] Inventor: Pol Buckinx, Diepenbeek, Belgium

[73] Assignee: GTE Products Corporation, Stamford, Conn.

[21] Appl. No.: 339,246

[22] Filed: Jan. 13, 1982

[51] Int. Cl.³ .............................................. H03H 9/64
[52] U.S. Cl. ................................ 333/194; 310/313 D; 310/367; 333/195
[58] Field of Search ............................... 333/150–155, 333/193–196; 331/107 A; 310/313 R, 313 A, 313 B, 313 C, 313 D, 367

[56] References Cited

U.S. PATENT DOCUMENTS 4,247,835  1/1981  Lewis ............................... 310/313 A
4,350,963  9/1982  Iwamoto et al. ..................... 333/195

Primary Examiner—Marvin L. Nussbaum
Attorney, Agent, or Firm—John A. Odozynski

[57] ABSTRACT

A surface acoustic wave filter comprises aluminum input and output transducers, an aluminum 3db coupler, an aluminum reflector, and a triangularly configured substrate constructed from lithium niobate. In a specific configuration the lengths of the sides of the substrate are equal to approximately 6.06, 9.25 and 11.05 millimeters respectively. The triangular configuration not only reduces the amount of substrate material required but also attenuates the degree of signal reflection encountered.

10 Claims, 1 Drawing Figure

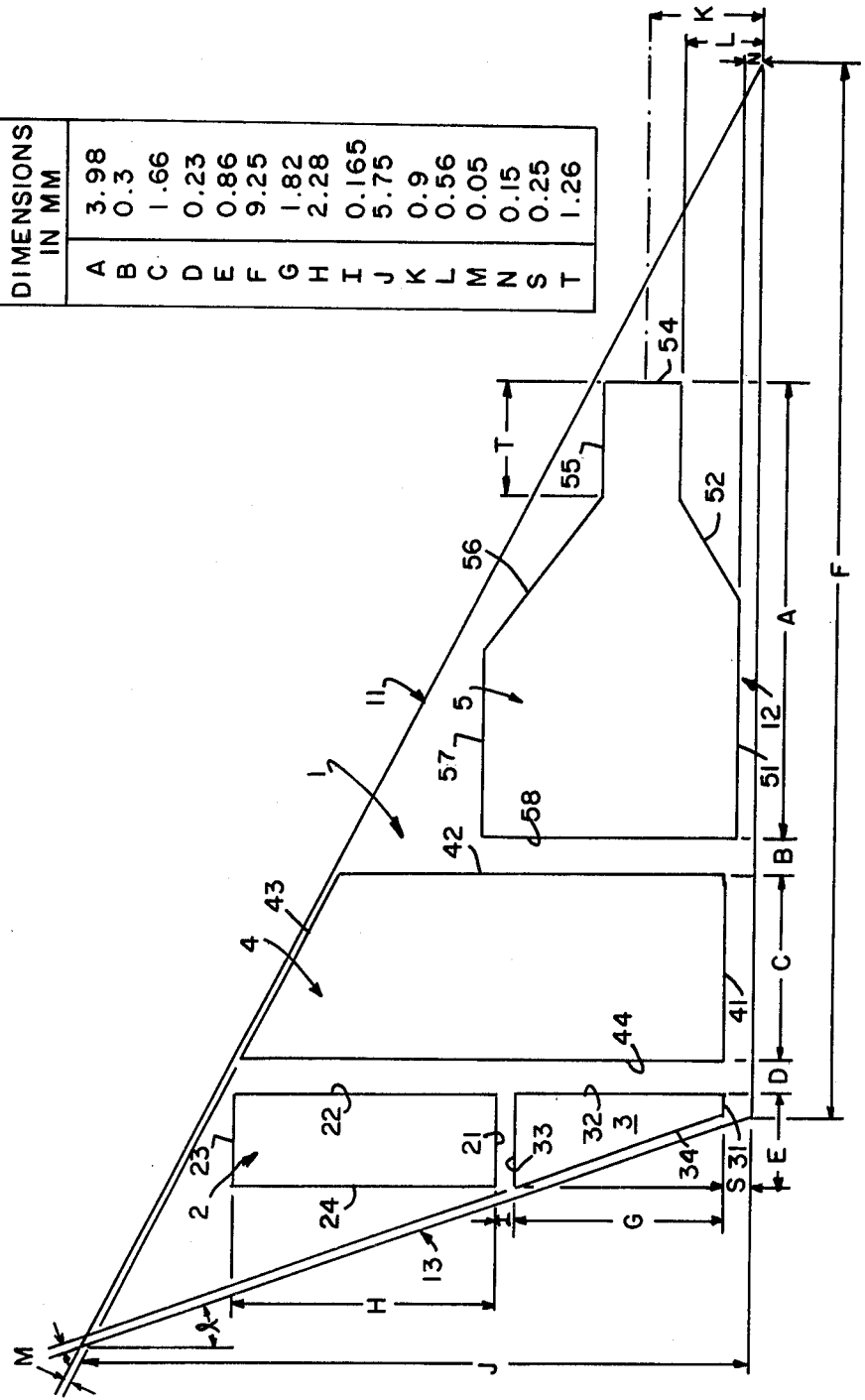

SURFACE ACOUSTIC WAVE FILTER

TECHNICAL FIELD

This invention relates to surface wave acoustic devices and more particularly to an improved configuration for a filter substrate.

BACKGROUND ART

Surface acoustic wave devices, comprising a piezoelectric substrate upon which are deposited various configurations of conductive transducers, have found wide-spread application in the processing of electronic signals. Specifically, many television receivers employ such devices as a filter in the intermediate frequency section of the receiver.

An example of such a surface wave acoustic (SAW) filter is described in U.S. Pat. No. 4,146,851, "Acoustic Surface Wave Device", assigned to the assignee of the subject invention and hereby incorporated by reference. The filter described therein includes a substantially rectangular substrate that may be constructed from, for example, lithium niobate. At a lower corner of one end of the substrate is deposited an input transducer in the form of a series of interdigitated conductive elements. At the upper corner of the opposite end of the substrate is deposited a similarly arranged output tranducer, also including a series of interdigitated conductive elements. Also included in the filter are a multi-strip coupler and a reflector. The coupler causes signals launched by the transducer to be directed in quadrature to both the output transducer and the reflector. The phase relationship between the signals directed to the output transducer and the reflector results in substantial cancellation of "triple-transit" signals as thoroughly described in the cited patent. This is a highly desirable effect because the triple-transit signals result in a ripple and other undesirable anomalies in the phase and frequency responses of filter.

The above explication was intended to convey some of the complexities inherent in the fabrication of a SAW filter and indicate the substrate surface area required. A somewhat differently configured SAW filter is described in U.S. Pat. No. 3,872,410. One of the salient features of that device is that the piezoelectric substrate is in the form of a parallelogram characterized by an acute angle in the range of 20 to 25 degrees. The parallelogram configuration has been found to reduce the back reflections generated by the piezoelectric material. (See Col. 4, lines 44 to 52 of that patent).

The subject invention is directed to an improved substrate configuration that not only attenuates the level of reflected signals but also significantly reduces the amount of substrate material required. The reduction in substrate surface area results in a substantial reduction in the total cost of the device, largely because of the expense of the niobium component of, for example, a lithium niobate substrate.

DISCLOSURE OF THE INVENTION

The invention is a surface wave acoustic filter comprising aluminum transducers deposited on a triangularly configured lithium niobate substrate. In a particular configuration, the length of the sides of the substrate assum values equal to approximately 6.05, 9.25 and 11.05 millimeters respectively.

The triangular configuration not only reduces by a factor of about one-half the amount of substrate material required but also attenuates the degree of signal reflection encountered.

BRIEF DESCRIPTION OF THE DRAWING

The sole drawing is a pictorial representation of the subject SAW filter.

BEST MODE FOR CARRYING OUT THE INVENTION

For a better understanding of the present invention, together with other and further objects, advantages and capabilities thereof, reference is made to the following disclosure and appended claims in connection with the above described drawing.

Referring now to the drawing, the subject surface wave acoustic filter includes, inter alia, a triangular substrate 1, which, in a preferred embodiment, is constructed from a piezoelectric material such as lithium niobate. Deposited on the substrate are an input transducer 5, an output transducer 2, a reflector 3 and a 3db coupler 4. The above elements are typically constructed from an electrically conductive material such as aluminum. The specific operation and configuration are not part of this invention but, nevertheless, are, for edification, detailed in the patent cited above.

As illustrated in the drawing, the filter substrate is triangularly configured and comprises first, second and third sides 11, 12 and 13, respectively. As indicated in the drawing the second side has a nominal dimension F, of 9.25 millimeters (mm). The third side of the substrate forms an angle, alpha, with an imaginary line that is perpendicular to the second side and has a length, J, nominally equal to 5.75 mm. In practice alpha has a nominal value of 18 degrees. From the above it can be demonstrated that the nominal lengths of sides 11, 12 and 13 (given the nominal value of alpha) are 11.05, 9.25 and 6.05 mm respectively.

In practice the length F, of the second side 12 may vary from 7 to 12 millimeters, the dimension J may vary from 3.0 to 10.0 mm, and the angle alpha may vary from 0 degrees to 36 degrees. Given that information it may be concluded the first side of the substrate may vary from approximately 7.6 to 17.2 mm, the second side from 7.0 to 12.0 mm, and the third side from 3.0 to 12.3 mm respectively. In addition, the thickness of the substrate may vary from approximately 0.1 to 1.0 mm, and again, may typically be constructed from lithium niobate, although other piezoelectric materials are certainly contemplated by this invention.

In addition, as shown in the drawing the input transducer 5 has an eight-sided perimeter, four sides (51, 53, 55 and 57) which are substantially parallel to the second side of the substrate; two sides 58 and 54 are substantantially perpendicular to the second side; sides 52 and 56 substend acute angles with the second and fourth sides respectively. The output transducer 2 is substantially rectangular and comprises sides 21 and 23, parallel to the first side of the substrate, and sides 22 and 24, arranged substantially perpendicular to it. The reflector 3 has two sides 31 and 33 substantially parallel to the second side, a side 32 substantially perpendicular to it and a side 34 substantially parallel to the third side. Finally the 3db coupler has a side 41 substantially parallel to the second side, sides 42 and 44 substantially perpendicular to it, and a side 43 substantially parallel to the first side.

To reiterate, the input and output transducers, coupler and reflector are not considered an essential aspect of the subject invention, but have been described to facilitate a complete understanding of the subject invention.

In general, the relevant dimensions of the substrate, input and output transducers, 3db coupler and filter may be derived from the drawing and the table included therein. In practice those dimensions may vary, in millimeters, as follows:

A 2.0 to 5.0 mm
B 0.1 to 0.5
C 1.0 to 2.0
D 0.1 to 0.5
E 2.0 to 5.0
F 7.0 to 12.0
G 0.0 to 2.0
H 1.0 to 3.0
I 0.1 to 0.5
J 3.0 to 10.0
K 0.3 to 1.5
L 0.0 to 1.5
M 0.0 to 0.4
N 0.1 to 0.2
S 0.1 to 0.3
T 0.0 to 3.0

The triangularly configured substrate exhibits at least two salient advantages. The surface area of the substrate may be estimated at approximately one-half of the substrate required in other known structures. In addition, the surface wave reflections from the output transducer, and therefore the triple-transit reflections, are substantially reduced as a result of the triangular configuration.

Accordingly, while there has been shown and described what at present are considered to be the preferred embodiments of the invention, it will be obvious to those skilled in the art that various changes and modifications may be made therein without departing from the scope of the invention as defined by the appended claims.

INDUSTRIAL APPLICABILITY

The subject invention is useful as a signal processing device in various types of electronic equipment and, in particular, as a surface acoustic wave filter for television receivers.

What is claimed is:

1. In a surface acoustic wave filter comprising an input transducer, an output transducer, a 3db coupler and a reflector, all of the above deposited on the surface of a piezoelectric substrate, the improvement comprising a substrate exhibiting a triangular perimeter, whereby the triangular substrate configuration reduces both the amount of substrate material required and the degree of signal reflection encountered.

2. An improvement as defined in claim 1 wherein the triangularly configured substrate comprises sides of length approximately equal to 6.05 millimeters, 9.25 millimeters and 11.05 millimeters.

3. An improvement as defined in claim 2 wherein the substrate is comprised of lithium niobate.

4. An improvement as defined in claim 3 wherein the substrate thickness varies from approximately 0.1 to 1.0 millimeter.

5. An improvement as defined in claim 4 wherein the input transducer, the output transducer, the 3db coupler and the reflector are comprised of aluminum.

6. A surface acoustic wave filter comprising:
an input transducer, an output transducer, a coupler, a reflector, and a triangular substrate.

7. A surface acoustic wave as defined in claim 6 wherein the length of the three sides of the substrate vary between 7.0 and 12.0 millimeters, 3.0 and 12.3 millimeters, and 7.6 and 17.2 millimeters respectively.

8. A surface acoustic wave filter as defined in claim 7 wherein the substrate is constructed from lithium niobate.

9. A surface acoustic wave filter as defined in claim 8 wherein the substrate thickness varies between 0.1 and 1.0 millimeter.

10. A surface acoustic wave filter as defined in either claim 6, claim 7, claim 8 or claim 9 wherein the length of the sides of the substrate are approximately equal to 6.05 millimeters, 9.25 millimeters and 11.05 millimeters.

* * * * *